United States Patent
Han et al.

(10) Patent No.: US 10,056,571 B2
(45) Date of Patent: Aug. 21, 2018

(54) ORGANIC LIGHT EMITTING DISPLAY DEVICE

(71) Applicant: LG DISPLAY CO., LTD., Seoul (KR)

(72) Inventors: Yoondeok Han, Seoul (KR); Hongseok Choi, Seoul (KR); SoYeon Ahn, Seoul (KR); JungSoo Park, Seoul (KR); Yosub Lee, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 14 days.

(21) Appl. No.: 15/163,462

(22) Filed: May 24, 2016

(65) Prior Publication Data

US 2017/0155070 A1    Jun. 1, 2017

(30) Foreign Application Priority Data

Nov. 26, 2015 (KR) ........................ 10-2015-0166686

(51) Int. Cl.
| | |
|---|---|
| *H01L 51/50* | (2006.01) |
| *H01L 51/52* | (2006.01) |
| *H01L 27/32* | (2006.01) |
| *H01L 27/12* | (2006.01) |

(52) U.S. Cl.
CPC ........ *H01L 51/504* (2013.01); *H01L 27/3209* (2013.01); *H01L 27/3246* (2013.01); *H01L 27/3248* (2013.01); *H01L 27/3258* (2013.01); *H01L 27/3262* (2013.01); *H01L 27/3276* (2013.01); *H01L 51/5004* (2013.01); *H01L 51/5278* (2013.01); *H01L 27/124* (2013.01); *H01L 27/1248* (2013.01); *H01L 51/5056* (2013.01); *H01L 51/5072* (2013.01); *H01L 2251/5384* (2013.01); *H01L 2251/552* (2013.01)

(58) Field of Classification Search
CPC .......... H01L 51/50; H01L 27/32; H01L 51/52
USPC ..................................... 257/79, 98
See application file for complete search history.

(56) References Cited

U.S. PATENT DOCUMENTS

| | | | |
|---|---|---|---|
| 2011/0057178 A1 | 3/2011 | Shitagaki et al. | |
| 2011/0073844 A1 | 3/2011 | Pieh et al. | |
| 2012/0205687 A1* | 8/2012 | Yamazaki | H01L 51/5016 257/89 |
| 2012/0248421 A1* | 10/2012 | Yamazaki | H01L 51/5016 257/40 |
| 2012/0305898 A1* | 12/2012 | Okamoto | H01L 51/5016 257/40 |
| 2013/0092909 A1* | 4/2013 | Han | H01L 51/5004 257/40 |
| 2013/0181194 A1* | 7/2013 | Lee | H01L 51/5044 257/40 |

FOREIGN PATENT DOCUMENTS

| | | |
|---|---|---|
| CN | 102484923 A | 5/2012 |
| KR | 10-2011-0035048 A | 4/2011 |

* cited by examiner

*Primary Examiner* — Sheng Zhu (74) *Attorney, Agent, or Firm* — Dentons US LLP (57) ABSTRACT

An organic light emitting display device includes: a first light emitting unit including a first light emitting layer; and a second light emitting unit on the first light emitting unit including a second light emitting layer. The first light emitting layer includes at least one dopant and at least two hosts. The at least two hosts are different from each other in electron mobility and hole mobility.

23 Claims, 4 Drawing Sheets

|  | Volt (V) | cd/A | EQE | CIEx | CIEy |
|---|---|---|---|---|---|
| COMPARATIVE EXAMPLE | 100% | 100% | 100% | 0.137 | 0.102 |
| EXAMPLE | 92.5% | 100% | 100% | 0.136 | 0.103 |

FIG. 4

ORGANIC LIGHT EMITTING DISPLAY DEVICE

CROSS-REFERENCE TO RELATED APPLICATIONS

This application claims the priority of Korean Patent Application No. 10-2015-0166686 filed on Nov. 26, 2015, in the Korean Intellectual Property Office, the disclosure of which is incorporated by reference in its entirety for all purposes as if fully set forth herein.

BACKGROUND

Field

The present disclosure relates to an organic light emitting display device, and more particularly, to improving the lifetime of an organic light emitting display device.

Description of the Related Art

Recently, as the world entered the information age, the field of electronic displays for visually displaying information has grown rapidly. Thus, various display devices with performance, such as thinning, weight lightening, and low power consumption have been developed.

Specific examples of the display devices include a Liquid Crystal Display (LCD) device, a Plasma Display Panel (PDP) device, a Field Emission Display (FED) device, an Organic Light Emitting Display (OLED) device, and the like.

Particularly, the OLED device is a self-light emitting device and has the advantages such as a high response speed, a high luminous efficiency, a high brightness, and a wide viewing angle as compared with the other display devices. Therefore, the OLED device has attracted a lot of attention.

SUMMARY

An organic light emitting element has a structure in which an anode is formed on a substrate and a hole transport layer, a light emitting layer, an electron transport layer, and a cathode are formed on the anode. The hole transport layer, the light emitting layer, and the electron transport layer are formed of organic compounds. When a voltage is applied between the anode and the cathode, holes injected from the anode are transferred to the light emitting layer through the hole transport layer. Also, electrons injected from the cathode are transferred to the light emitting layer through the electron transport layer. The holes and electrons as carriers are recombined into excitons in the light emitting layer. When the excitons transition from an excited state to a ground state, light is generated. Herein, an area where the holes and the electrons are recombined is referred to as a recombination area (recombination zone) or an emission area (emission zone).

The light emitting layer includes a host and a dopant. If any one among a hole mobility or an electron mobility of the host is high, the recombination area where the holes and the electrons are recombined cannot be generated in the light emitting layer. Instead, the excitons are generated at an interface between the electron transport layer and the light emitting layer or at an interface between the hole transport layer and the light emitting layer. Thus, the light emitting layer cannot contribute to emission but damage the hole transport layer or electron transport layer adjacent to the light emitting layer, which causes an reduction in lifetime. Further, it becomes difficult to transfer electrons or holes to the light emitting layer, and, thus, a driving voltage is increased. As a method for reducing a driving voltage, there is a method of changing a material of the host or a method of adjusting a doping concentration of the host. However, the method of changing a material of the host needs to be verified in terms of reliability and takes a lot of time to be applied to mass production. As for the method of adjusting a doping concentration of the host, it is difficult to regulate a balance between holes and electrons, which causes a reduction in luminous efficiency. Further, if a mixed host including a hole-type host and an electron-type host is used as the host in the light emitting layer, it is difficult to regulate a balance between holes and electrons in the light emitting layer.

Accordingly, the inventors of the present disclosure recognized the above-described problems and conducted various experiments for improving a lifetime by regulating characteristics of the host included in the light emitting layer. Through the various experiments, the inventors invented a novel structure of an organic light emitting display device which can improve lifetime.

An object to be achieved by the present disclosure is to provide an organic light emitting display device with an improved lifetime. In the organic light emitting display device, a light emitting layer includes at least two hosts which are different from each other in electron mobility and hole mobility, so that a recombination area where holes and electrons are recombined is located in the light emitting layer.

The objects of the present disclosure are not limited to the aforementioned objects, and other objects, which are not mentioned above, will be apparent to a person having ordinary skill in the art from the following description.

According to an aspect of the present disclosure, there is provided an organic light emitting display device including: a first light emitting unit including a first light emitting layer; and a second light emitting unit on the first light emitting unit including a second light emitting layer. The first light emitting layer includes at least one dopant and at least two hosts. The at least two hosts are different from each other in electron mobility and hole mobility.

According to another aspect of the present disclosure, there is provided an organic light emitting display device including: a plurality of light emitting units between an anode and a cathode including a plurality of light emitting layers. At least one among the plurality of light emitting layers includes at least one dopant and at least two hosts. The at least two hosts include a first host including a first hole-type host and a first electron-type host and a second host including a second electron-type host.

According to yet another aspect of the present disclosure, there is provided an organic light emitting display device including: a plurality of light emitting units between an anode and a cathode including a plurality of light emitting layers. At least one among the plurality of light emitting layers includes two areas. A first area among the two areas includes a mixed host and a second area includes a single host.

According to yet another aspect of the present disclosure, there is provided an organic light emitting display device having light emitting layers between an anode and a cathode. The light emitting layers include a blue light emitting layer. The blue light emitting layer includes at least two hosts and is improved in electron mobility and hole mobility and thus reduced in driving voltage as compared with a blue light emitting layer including a single host.

Details of other exemplary embodiments will be included in the detailed description of the disclosure and the accompanying drawings.

The present disclosure includes a blue light emitting layer includes at least two hosts which are different from each other in electron mobility and hole mobility. Therefore, it is possible to provide an organic light emitting display device which is improved in efficiency by adjusting a balance between holes and electrons in a light emitting layer and thus reduced in driving voltage.

Further, according to the present disclosure, of the hosts included in the blue light emitting layer, a mixed host including an electron-type host and a hole-type host is adjacent to a hole transport layer. Therefore, it is possible to adjust a balance between holes and electrons in the blue light emitting layer and thus possible to reduce a driving voltage of the organic light emitting display device.

Furthermore, according to the present disclosure, of the hosts included in the blue light emitting layer, a single host including an electron-type host is adjacent to an electron transport layer. Therefore, it is possible to adjust a balance between holes and electrons in the blue light emitting layer and thus possible to reduce a driving voltage of the organic light emitting display device.

Also, the present disclosure includes the blue light emitting layer including at least two hosts which are different from each other in electron mobility and hole mobility. Therefore, it is possible to provide the organic light emitting display device with a reduced driving voltage as compared with a blue light emitting layer including a single host.

The effects of the present disclosure are not limited to the above-described effects. Although not described herein, other effects can be clearly understood by those skilled in the art from the following description.

The objects to be achieved by the present disclosure, the means for achieving the objects, and the effects of the present disclosure described above do not specify essential features of the claims, and, thus, the scope of the claims is not limited to the disclosure of the present disclosure.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENTS

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When the time sequence between two or more incidents is described using the terms such as "after", "subsequent to", "next to", and "before", two or more incidents may be inconsecutive unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely bonded to or combined with each other and can be interlocked and operated in technically various ways, and the embodiments can be carried out independently of or in association with each other.

Hereinafter, exemplary embodiments of the present disclosure will be described in detail with reference to the accompanying drawings.

Figure 1:
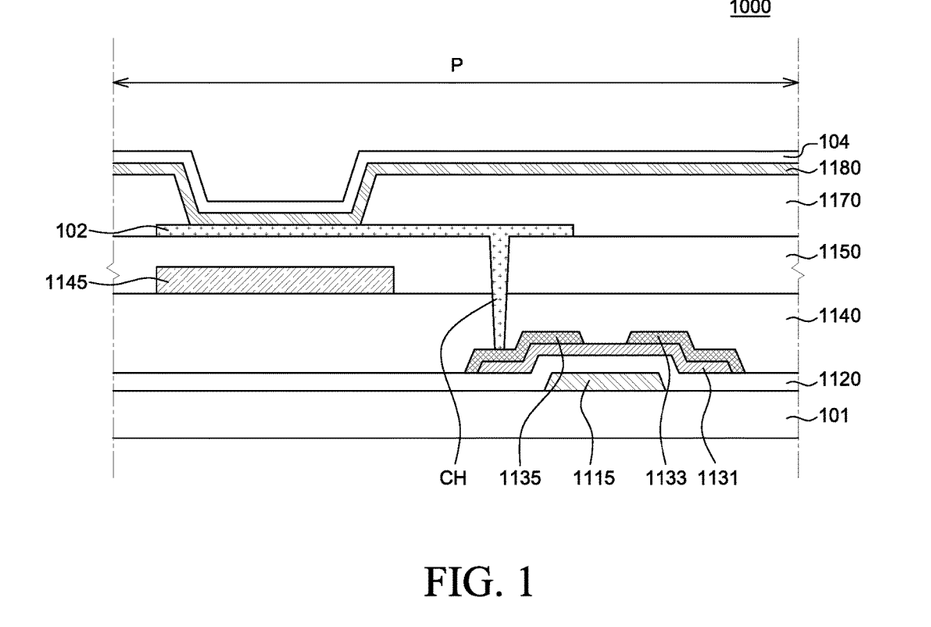
FIG. 1 is a diagram illustrating an organic light emitting display device according to an exemplary embodiment of the present disclosure.

FIG. 1 is a diagram illustrating an organic light emitting display (OLED) device 1000 according to an exemplary embodiment of the present disclosure.

Referring to FIG. 1, the OLED device 1000 includes a substrate 101, a first electrode 102, a light emitting unit 1180, and a second electrode 104. The OLED device 1000 includes a plurality of pixels P. The pixel P refers to a minimum unit that actually emits a light, and may also be referred to as a sub-pixel or a pixel area. Further, a plurality of pixels P may form a minimum group capable of expressing a white light. For example, three sub-pixels including a red pixel, a green pixel, and a blue pixel may form a single group. Otherwise, four sub-pixels including a red pixel, a green pixel, a blue pixel, and a white pixel may form a single group. However, the present disclosure is not limited thereto. The pixels may be designed in various ways. FIG. 1 illustrates only one pixel P for convenience in explanation.

A thin film transistor TFT includes a gate electrode 1115, a gate insulation layer 1120, a semiconductor layer 1131, a source electrode 1133, and a drain electrode 1135. The TFT is disposed on the substrate 101 and configured to supply a signal to an organic light emitting element including the first electrode 102, the light emitting unit 1180, and the second electrode 104. The TFT illustrated in FIG. 1 may be a driving thin film transistor connected to the first electrode 102. A switching thin film transistor or a capacitor for driving the organic light emitting element may be further formed on the substrate 101. Although FIG. 1 illustrates the TFT as an inverted staggered structure, the TFT may be a coplanar structure.

The substrate 101 may include an insulation material or a material having flexibility. The substrate 101 may be formed of glass, metal, or plastic, but is not limited thereto. If the OLED device 1000 is a flexible OLED device, the substrate 101 may be formed of a flexible material such as plastic. Further, if an organic light emitting element that facilitates flexibility is applied to a lighting apparatus for vehicle, the degree of freedom in design of a lighting apparatus for vehicle can be secured according to a structure or external shape of a vehicle.

The gate electrode 1115 is formed on the substrate 101 and connected to a gate line (not shown). The gate electrode 1115 may be a multilayer formed of any one among molybdenum (Mo), aluminum (Al), chromium (Cr), gold (Au), titanium (Ti), nickel (Ni), neodymium (Nd), copper (Cu), and alloys thereof.

The gate insulation layer 1120 is formed on the gate electrode 1115. The gate insulation layer 1120 may be a silicon oxide (SiOx) film, a silicon nitride (SiNx) film, or a multilayer thereof, but is not limited thereto.

The semiconductor layer 1131 is formed on the gate insulation layer 1120. The semiconductor layer 1131 may be formed of amorphous silicon (a-Si), polycrystalline silicon (poly-Si), an oxide semiconductor, an organic semiconductor, or the like. If the semiconductor layer is formed of an oxide semiconductor, the semiconductor layer may be formed of indium tin oxide (ITO), indium zinc oxide (IZO), indium tin zinc oxide (ITZO), or the like, but is not limited thereto. Further, an etch stopper may be formed on the semiconductor layer 1131 to protect the semiconductor layer 1131, or may be omitted according to a configuration of the device.

The source electrode 1133 and the drain electrode 1135 may be formed on the semiconductor layer 1131. Each of the source electrode 1133 and the drain electrode 1135 may be a single layer or a multilayer and may be formed of any one among molybdenum (Mo), aluminum (Al), chromium (Cr), gold (Au), titanium (Ti), nickel (Ni), neodymium (Nd), copper (Cu), and alloys thereof.

A protection layer 1140 is formed on the source electrode 1133 and the drain electrode 1135. The protection layer 1140 may be a silicon oxide (SiOx) film, a silicon nitride (SiNx) film, or a multilayer thereof. Otherwise, the protection layer 1140 may be formed of acryl-based resin or polyimide resin, but is not limited thereto.

A color layer 1145 is formed on the protection layer 1140. Although FIG. 1 illustrates only one pixel P, the color layer 1145 may be formed on an area for a red pixel, a blue pixel, and a green pixel. The color layer 1145 may include a red (R) color filter, a green (G) color filter, and a blue (B) color filter formed as patterns for the respective pixels. The color layer 1145 transmits only light having a wavelength band among white lights emitted from the light emitting unit 1180.

An overcoating layer 1150 is formed on the color layer 1145. The overcoating layer 1150 may be acryl-based resin or polyimide resin, a silicon oxide (SiOx) film, a silicon nitride (SiNx) film, or a multilayer thereof, but is not limited thereto.

The first electrode 102 is formed on the overcoating layer 1150. The first electrode 102 may be formed of a transparent conductive material including transparent conductive oxide (TCO) such as indium tin oxide (ITO) or indium zinc oxide (IZO), but is not limited thereto. The first electrode 102 is electrically connected to the drain electrode 1135 through a contact hole CH in a predetermined area of the protection layer 1140 and the overcoating layer 1150. FIG. 1 illustrates that the drain electrode 1135 is electrically connected to the first electrode 102. However, the source electrode 1133 may be electrically connected to the first electrode 102 through the contact hole CH in the predetermined area of the protection layer 1140 and the overcoating layer 1150.

The OLED device 1000 illustrated in FIG. 1 is of a bottom-emission type. Thus, a light emitted from the light emitting unit 1180 may penetrate the first electrode 102 and then may be released in a downward direction. Further, if the OLED device 1000 is of a top-emission type, a light emitted from the light emitting unit 1180 may penetrate the second electrode 104 and then may be released in an upward direction.

A bank layer 1170 is formed on the first electrode 102 and configured to define a pixel area. That is, since the bank layer 1170 is formed into a matrix structure at a boundary between a plurality of pixels, the pixel area is defined by the bank layer 1170. The bank layer 1170 may be formed of an organic material such as benzocyclobutene (BCB)-based resin, acryl-based resin, or polyimide resin. Otherwise, the bank layer 1170 may be formed of a photosensitizer including a black pigment. In this case, the bank layer 1170 functions as a light shielding member.

The light emitting unit 1180 is formed on the bank layer 1170 and the first electrode 102.

The second electrode 104 is formed on the light emitting unit 1180. The second electrode 104 may be formed of gold (Au), silver (Ag), aluminum (Al), molybdenum (Mo), magnesium (Mg), or the like, or may be formed of alloys thereof, but is not limited thereto.

Further, an encapsulation unit may be provided on the second electrode 104. The encapsulation unit has a function of suppressing infiltration of moisture into the light emitting unit 1180. The encapsulation unit may be formed of a plurality of layers in which various inorganic materials are laminated or a plurality of layers in which inorganic materials and organic materials are laminated alternately. Further, an encapsulation substrate may be further provided on the encapsulation unit. The encapsulation substrate may be formed of glass or plastic, or may be formed of metal. The encapsulation substrate may be bonded to the encapsulation unit with an adhesive.

Figure 2:
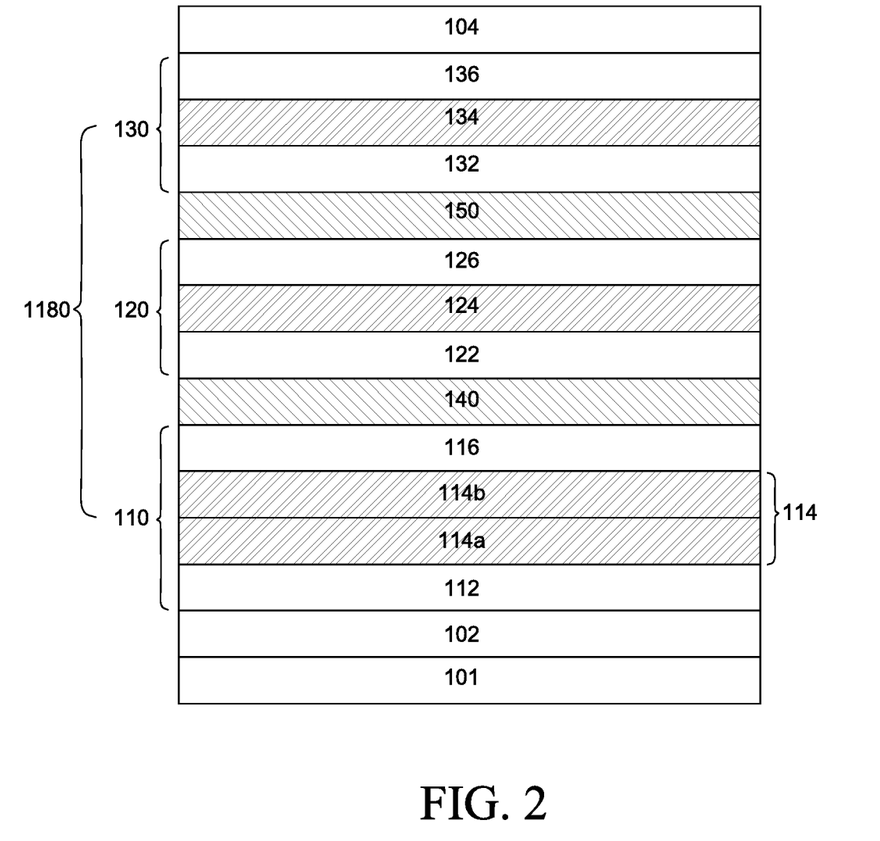
FIG. 2 is a diagram illustrating an organic light emitting element according to an exemplary embodiment of the present disclosure.

FIG. 2 is a diagram illustrating an organic light emitting element according to an exemplary embodiment of the present disclosure.

The organic light emitting element illustrated in FIG. 2 includes the substrate 101, the first electrode 102, the second electrode 104, and the light emitting unit 1180 between the first electrode 102 and the second electrode 104 and including a first light emitting unit 110, a second light emitting unit 120, and a third light emitting unit 130.

The substrate 101 may be formed of an insulation material or a material having flexibility. The substrate 101 may be formed of glass, metal, plastic, or the like, but is not limited thereto. If the OLED device is a flexible OLED device, the substrate 101 may be formed of a flexible material such as plastic. Further, if an organic light emitting element that facilitates flexibility is applied to a lighting apparatus for vehicle, the degree of freedom in design of a lighting apparatus for vehicle can be secured according to a structure or external shape of a vehicle.

The first electrode 102 is an anode configured to supply holes and may be formed of a transparent conductive material including transparent conductive oxide (TCO) such as indium tin oxide (ITO) or indium zinc oxide (IZO), but is not necessarily limited thereto.

The second electrode 104 is a cathode configured to supply electrons and may be formed of gold (Au), silver (Ag), aluminum (Al), molybdenum (Mo), magnesium (Mg), or may be formed of alloys thereof, but is not necessarily limited thereto.

The first electrode 102 and the second electrode 104 may be referred to as the anode and the cathode, respectively. Otherwise, the first electrode 102 may be formed as a transflective electrode or a transparent electrode and the second electrode 104 may be formed as a reflective electrode. Alternatively, the first electrode 102 may be formed as a reflective electrode and the second electrode 104 may be formed as a transflective electrode or a transparent electrode.

The first light emitting unit 110 may be formed on the first electrode 102 and may include a first hole transport layer (HTL) 112, a first light emitting layer (EML) 114, and a first electron transport layer (ETL) 116.

A hole injection layer (HIL) (not shown) may be optionally provided on the first electrode 102. The HIL has a function of smoothly injecting holes from the first electrode 102 into the first EML 114.

The first HTL 112 supplies the holes from the HIL to the first EML 114. The first ETL 116 supplies electrons from the second electrode 104 to the first EML 114. Thus, the holes supplied by the first HTL 112 and the electrons supplied by the first ETL 116 are recombined into excitons in the first EML 114. An area where the excitons are generated may be referred to as a recombination zone (recombination area) or an emission zone (emission area).

Optionally, the first ETL 116 may be formed using two or more layers or two or more materials. Further, an electron injection layer (EIL) may be further provided on the first ETL 116.

A hole blocking layer (HBL) (not shown) may be further provided on the first EML 114. The HBL suppresses a transfer of holes injected into the first EML 114 to the first ETL 116 so as to improve recombination between electrons and holes in the first EML 114. Therefore, luminous efficiency of the first EML 114 can be improved. The first ETL 116 and the HBL may also be formed as a single layer. Further, the first ETL 116, the HBL, the EIL, and the like may be referred to as electron transfer layers. That is, the electron transfer layer may be a layer for injecting or transferring electrons.

An electron blocking layer (EBL) (not shown) may be further provided under the first EML 114. The EBL suppresses a transfer of electrons injected into the first EML 114 to the first HTL 112 so as to improve recombination between electrons and holes in the first EML 114. Therefore, luminous efficiency of the first EML 114 can be improved. The first HTL 112 and the EBL may be formed as a single layer. Further, the first HTL 112, the EBL, and the HIL may be referred to as hole transfer layers. That is, the hole transfer layer may be a layer for injecting or transferring holes.

The first EML 114 may be configured to emit a light of a first color. That is, the first EML 114 may include one among a blue light emitting layer, a deep blue light emitting layer, and a sky blue light emitting layer. The first EML 114 may have an emission area in the range of from 440 nm to 480 nm.

The first EML 114 may be a blue light emitting layer including an auxiliary light emitting layer capable of emitting a light of another color. The auxiliary light emitting layer may include one among a yellow-green light emitting layer or a red light emitting layer or a combination thereof. If the auxiliary light emitting layer is further provided, efficiency of green or red may be further improved. If the first EML 114 is configured to include the auxiliary light emitting layer, a yellow-green light emitting layer, a red light emitting layer, or a green light emitting layer may be on or under the first EML 114. Further, a yellow-green light emitting layer, a red light emitting layer, or a green light emitting layer may be used as the auxiliary light emitting layer on and under the first EML 114 in the same manner or different manners. A location or the number of light emitting layers may be selected according to a configuration or characteristics of the device, but is not necessarily limited thereto.

If the auxiliary light emitting layer is included in the first EML 114, the first EML 114 may have an emission area in the range of from 440 nm to 650 nm.

The first HTL 112, the first EML 114, the first ETL 116, the EIL, the HIL, the HBL, and the EBL constituting the first light emitting unit 110 may be referred to as organic layers.

If the first EML 114 includes a host and a dopant, the host may be a hole-type host or an electron-type host. If the first EML 114 is formed of the hole-type host or the electron-type host, a recombination zone (recombination area) where holes and electrons are recombined may not be formed in the first EML 114 due to a difference in electron mobility or hole mobility. Instead, the recombination zone is formed at an interface between the first EML 114 and the first HTL 112 or at an interface between the first EML 114 and the first ETL 116. Otherwise, if the hole-type host is adjacent to the first HTL 112 and the electron-type host is adjacent to the first ETL 116, holes of the hole-type host rapidly move. Thus, it is difficult to maintain a balance between holes and electrons in the first EML 114. Therefore, efficiency is reduced. Accordingly, in the present disclosure, the first EML 114 includes at least one dopant and at least two hosts such that the recombination zone (recombination area) where holes and electrons are recombined is in the first EML 114. Further, the at least two hosts are different from each other in electron mobility and hole mobility. One among the at least two hosts may be a mixed host, and the mixed host includes a hole-type host having a hole transporting property and an electron-type host having an electron transporting property. Further, the other one among the at least two hosts may be a single host including an electron-type host having an electron transporting property. Therefore, the hosts included in the first EML 114 may include a first host 114a including a first hole-type host and a first electron-type host and a second host 114b including a second electron-type host.

The first hole-type host of the first host 114a has a higher electron mobility and a higher hole mobility than the first electron-type host. Further, an electron mobility of the first hole-type host of the first host 114a may be higher than a hole mobility of the first hole-type host of the first host 114a. Furthermore, an electron mobility of the first electron-type hosts of the first host 114a and an electron mobility of the second electron-type host of the second host 114b may be higher than a hole mobility of the first electron-type hosts of the first host 114a and a hole mobility of the second electron-type host of the second host 114b. That is, the electron mobility and the hole mobility of the first host 114a are higher than the electron mobility and the hole mobility of the second host 114b. Thus, a transfer or injection of holes from the first HTL 112 to the first EML 114 may be improved. Further, the electron mobility of the second host 114b is lower than the electron mobility of the first host 114a. Thus, electrons may be slowly transferred or injected from the first ETL 116 to the first EML 114 so as to be present in the first EML 114. Therefore, it is possible to solve the problem of formation of an emission zone of the first EML 114 at an interface between the first HTL 112 and the first EML 114.

Since the first host 114a and the second host 114b are different from each other in electron mobility and hole mobility, it is possible to maintain a balance between holes and electrons in the first EML 114. Therefore, it is possible to reduce a driving voltage and thus possible to improve a lifetime.

The hole mobility of the first electron-type host of the first host 114a may be in the range of from $1 \times 10^{-8}$ cm$^2$/Vs to $1 \times 10^{-9}$ cm$^2$/Vs. The electron mobility of the first electron-type host of the first host 114a may be in the range of from $1 \times 10^{-3}$ cm$^2$/Vs to $1 \times 10^{-4}$ cm$^2$/Vs. Further, the hole mobility of the first hole-type host of the first host 114a may be in the range of from $1 \times 10^{-7}$ cm$^2$/Vs to $1 \times 10^{-8}$ cm$^2$/Vs. The electron mobility of the first hole-type host of the first host 114a may be in the range of from $1 \times 10^{-2}$ cm$^2$/Vs to $1 \times 10^{-3}$ cm$^2$/Vs.

Further, the hole mobility of the second electron-type host of the second host 114b may be in the range of from $1 \times 10^{-8}$ cm$^2$/Vs to $1 \times 10^{-9}$ cm$^2$/Vs. The electron mobility of the second electron-type host of the second host 114b may be in the range of from $1 \times 10^{-3}$ cm$^2$/Vs to $1 \times 10^{-4}$ cm$^2$/Vs.

The first electron-type host of the first host 114a and the second electron-type host of the second host 114b may be formed of materials having hole mobility and electron mobility in the same ranges, but are not limited thereto.

Further, the first host 114a is adjacent to the first HTL 112 as a hole transfer layer, and the second host 114b is adjacent to the first ETL 116 as an electron transfer layer. If the first host 114a is closer to the first ETL 116 than to the first HTL 112, electrons of the first ETL 116 do not stay in the first EML 114 due to the high electron mobility and hole mobility of the first host 114a. Instead, the electrons are accumulated at an interface between the first HTL 112 and the first EML 114. Therefore, the first host 114a is closer to the first HTL 112 than to the first ETL 116, and, thus, it is possible to maintain a balance between holes and electrons in the first EML 114. Therefore, it is possible to reduce a driving voltage and, possible to improve lifetime. Further, the second host 114b is closer to the first ETL 116 than to the first HTL 112, and, thus, it is possible to maintain a balance between holes and electrons in the first EML 114 by adjusting an injection or transfer of electrons. Therefore, it is possible to reduce a driving voltage and possible to improve lifetime.

Further, the first EML 114 may include two areas. Specifically, the first EML 114 may include two areas having the same thickness. A thickness of the first EML 114 may be in the range of from 10 nm to 40 nm. For example, if the thickness of the first EML 114 is 10 nm, each of the two areas may have a thickness of 5 nm. Of the two areas of the first EML 114, a first area may be formed of the first host 114a which is a mixed host, and a second area may be formed of the second host 114b which is a single host. Further, the first host 114a which is a mixed host included in the first area may include the first electron-type host and the first hole-type host. The second host 114b which is a single host included in the second area may include the second electron-type host. Furthermore, the first area may be adjacent to the HTL hole transfer layer and the second area may be adjacent to the ETL.

The first host 114a is a mixed host and adjacent to the first HTL 112 as a hole transfer layer and the second host 114b is a single host and adjacent to the first ETL 116. Thus, it is possible to maintain a balance between holes and electrons in the first EML 114. Further, a balance between holes and electrons in the first EML 114 can be regulated by adjusting a ratio between the first hole-type host and the first electron-type host as the mixed host included in the first host 114a. Thus, it is possible to reduce a driving voltage of the organic light emitting element and also possible to further improve efficiency of the organic light emitting element. Therefore, the first hole-type host and the first electron-type host included in the first host 114a may have the same ratio. That is, the first hole-type host and the first electron-type host may have a volume ratio of 5:5 in the first host 114a. Herein, the volume ratio refers to a volume of a portion occupied by a certain material in a certain layer. The volume ratio is based on the sum of volumes.

If the first hole-type host has a higher ratio than the first electron-type host in the mixed host, more holes are injected from the first HTL 112 into the first EML 114 since the first hole-type host has the higher electron mobility and hole mobility than the first electron-type host. The holes injected into the first EML 114 do not stay in the first EML 114 but are accumulated at an interface between the first EML 114 and the first ETL 116. Therefore, holes and electrons in the first EML 114 are out of balance, and, thus, luminous efficiency of the first EML 114 may be reduced.

Further, if the first electron-type host has a higher ratio than the first hole-type host in the mixed host, less holes are injected from the first HTL 112 into the first EML 114 as compared with a case where the first electron-type host and the first hole-type host have the same ratio. Since the amount of the first hole-type host is reduced, a moving route of the holes is shortened. Therefore, holes and electrons in the first EML 114 are out of balance. Accordingly, an emission area of the first EML 114 may be shifted to the first HTL 112. Thus, a driving voltage may be increased and lifetime may be reduced.

Accordingly, if the first hole-type host and the first electron-type host have different ratios, there is a change in a transfer of electrons and holes into the first EML 114. Thus, an emission area of the first EML 114 is shifted, so that it is difficult to implement color coordinates as desired. Further, electrons and holes are out of balance, and, thus, a lifetime is reduced. Also, if the first hole-type host and the first electron-type host do not have the same ratio, the host having a lower ratio cannot stay in the first EML 114 but may be sparsely present in the first EML 114. Therefore, the first host 114a may lose a function as a mixed host.

Further, an absolute value of a lowest unoccupied molecular orbitals (LUMO) energy level and an absolute value of a highest occupied molecular orbitals (HOMO) energy level of the first host 114a are set to be the same as an absolute value of an LUMO energy level and an absolute value of an HOMO energy level of the second host 114b in order for an energy barrier in the first EML 114 not to interrupt a transfer or injection of holes and electrons. That is, the absolute values of the LUMO energy levels of the first host 114a and the second host 114b may be in the range of from 3.0 eV to 6.0 eV. Further, the absolute values of the HOMO energy levels of the first host 114a and the second host 114b may be in the range of from 1.0 eV to 3.0 eV. The first host 114a and the second host 114b may have the same absolute value of the LUMO energy levels and the same absolute value of the HOMO energy levels. In this case, it is possible to minimize accumulation of holes at an interface between the first HTL 112 and the first EML 114 while holes are transferred from the first HTL 112. Further, it is possible to minimize accumulation of electrons at an interface between the first ETL 116 and the first EML 114 while electrons are transferred from the first ETL 116. Thus, degradation caused by accumulated holes or electrons at an interface between the first HTL 112 or the first ETL 116 and the first EML 114 adjacent thereto can be reduced. Therefore, it is possible to improve efficiency of the OLED device 1000 and also possible to reduce a driving voltage thereof.

The first hole-type host may be, for example, one among pyrene-based materials or distyrylarylene-based materials, but is not limited thereto. Further, the first electron-type host and the second electron-type host may be, for example, an anthracene-based material, but is not limited thereto. Furthermore, the dopant included in the first EML 114 may be a perylene-based material or DPAVBi (4,4'-bis[4-(di-p-tolylamini) styryl]biphenyl), but is not limited thereto.

A method for forming the first host 114a and the second host 114b of the first EML 114 will be described below with reference to FIG. 3.

Figure 3:
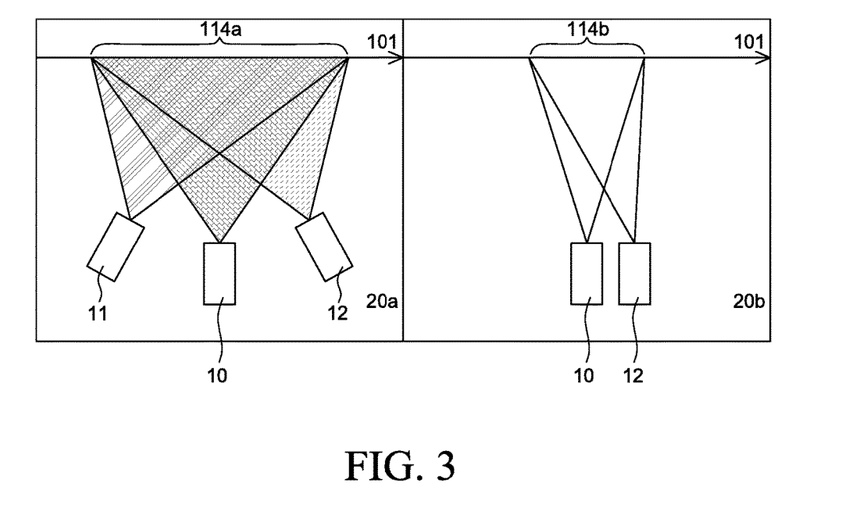
FIG. 3 is a diagram illustrating a method for forming a light emitting layer according to an exemplary embodiment of the present disclosure.

FIG. 3 is a diagram illustrating a method for forming a light emitting layer according to an exemplary embodiment of the present disclosure.

The first host 114a and the second host 114b of the first EML 114 are formed in two chambers. The first host 114a of the first EML 114 can be formed by a co-deposition method. Specifically, a first deposition source 10 including a first material, a second deposition source 11 including a second material, and a third deposition source 12 including a third material are disposed at a bottom of the first chamber 20a. The substrate 101 is disposed at a top of the first chamber 20a. The substrate 101 includes one surface on which the first host 114a is formed and which is disposed to face the deposition sources 10, 11, and 12. Then, when the substrate 101 is moved in a direction (indicated by an arrow) of the first chamber 20a, the first material, the second material, and the third material are sprayed from the first deposition source 10, the second deposition source 11, and the third deposition source 12, respectively. While the substrate 101 is moved, the dopant as the first material evaporated from the first deposition source 10 is deposited on the substrate 101. Then, the hole-type host as the second material evaporated from the second deposition source 11 and the electron-type host as the third material evaporated from the third deposition source 12 are deposited at the same time, so that the first host 114a is formed. Further, a ratio between the hole-type host as the second material and the electron-type host as the third material in the first host 114a can be adjusted by deposition rates (nm/s) of the second deposition source 11 and the third deposition source 12. For example, if a deposition rate of the second deposition source 11 is the same as a deposition rate of the third deposition source 12, the hole-type host as the second material in the first host 114a may be formed at the same ratio as the electron-type host as the third material. Further, the second deposition source 11 and the third deposition source 12 are disposed to slant to the substrate 101. Thus, it is possible to suppress non-uniform deposition of the hole-type host as the second material and the electron-type host as the third material. In order to dispose the second deposition source 11 and the third deposition source 12 to slant to the substrate 101, stages may be further provided under the first deposition source 10, the second deposition source 11, and the third deposition source 12. A stage corresponding to the first deposition source 10 may be perpendicular, and stages corresponding to the second deposition source 11 and the third deposition source 12 may be angled. However, the present disclosure is not limited thereto.

The second host 114b of the first EML 114 is formed in a second chamber 20b. Specifically, the first deposition source 10 including the first material and the third deposition source 12 including the third material are disposed at a bottom of the second chamber 20b. The substrate 101 is at a top of the second chamber 20b. The substrate 101 includes one surface on which the second host 114b is formed and which is disposed to face the deposition sources 10 and 12. Then, when the substrate 101 is moved in a direction (indicated by an arrow) of the second chamber 20b, the first material and the third material are sprayed from the first deposition source 10 and the third deposition source 12, respectively. While the substrate 101 is moved, the dopant as the first material evaporated from the first deposition source 10 is deposited on the substrate 101. Then, the electron-type host as the third material evaporated from the third deposition source 12 is deposited, so that the second host 114b is formed.

The second light emitting unit 120 and the third light emitting unit 130 will be described below with reference to FIG. 2 again.

The second light emitting unit 120 includes a second HTL 122, a second EML 124, and a second ETL 126.

An EIL may be further provided on the second ETL 126. Further, an HIL layer may be further provided under the second HTL 122. Furthermore, the second ETL 126 may be formed using two or more layers or two or more materials.

An HBL may be further provided on the second EML 124. The HBL suppresses a transfer of holes injected into the second EML 124 to the second ETL 126 so as to improve recombination between electrons and holes in the second EML 124. Therefore, luminous efficiency of the second EML 124 can be improved. The second ETL 126 and the HBL may also be formed as a single layer. Further, the second ETL 126, the HBL, and the EIL may be referred to as electron transfer layers. That is, the electron transfer layer may be a layer for injecting or transferring electrons.

An EBL may be further provided under the second EML 124. The EBL suppresses a transfer of electrons injected into the second EML 124 to the second HTL 122 so as to improve recombination between electrons and holes in the second EML 124. Therefore, luminous efficiency of the second EML 124 can be improved. The second HTL 122 and the EBL may be formed as a single layer. Further, the second HTL 122, the EBL, and the HIL may be referred to as hole transfer layers. That is, the hole transfer layer may be a layer for injecting or transferring holes.

In the second EML 124, the holes supplied by the second HTL 122 and the electrons supplied by the second ETL 126 are recombined into excitons. An area where the excitons are generated may be referred to as a recombination zone (recombination area) or an emission zone (emission area).

The second EML 124 may be configured to emit a light of a second color. That is, the second EML 124 may include a yellow-green light emitting layer or a green light emitting layer. The second EML 124 may have an emission area in the range of from 510 nm to 590 nm. The second EML 124 may include at least one host and a dopant. Otherwise, the second EML 124 may include a mixed host including two or more hosts and at least one dopant. The mixed host may include a host having a hole transporting property and a host having an electron transporting property.

The second HTL 122, the second EML 124, the second ETL 126, the EIL, the HIL, the HBL, and the EBL constituting the second light emitting unit 120 may be referred to as organic layers.

A first charge generation layer (CGL) 140 may be further provided between the first light emitting unit 110 and the second light emitting unit 120. The first CGL 140 is configured to adjust a balance of charges between the first light emitting unit 110 and the second light emitting unit 120. The first CGL 140 may include a first N-type charge generation layer (N-CGL) and a first P-type charge generation layer (P-CGL).

The first N-CGL has a function of injecting electrons into the first light emitting unit 110. The first P-CGL has a function of injecting holes into the second light emitting unit 120.

The first N-CGL may be formed as an organic layer doped with alkali metal such as lithium (Li), sodium (Na), potassium (K), or cesium (Cs), or alkali earth metal such as magnesium (Mg), strontium (Sr), barium (Ba), or radium (Ra), but is not necessarily limited thereto.

The first P-CGL may be formed as an organic layer including a P-type dopant, but is not necessarily limited thereto. The first CGL 140 may be formed as a single layer.

The third light emitting unit 130 may be disposed on the second light emitting unit 120 and may include a third HTL 132, a third EML 134, and a third ETL 136.

An EIL may be further provided on the third ETL 136. Further, the third ETL 136 may be formed using two or more layers or two or more materials. Furthermore, an HIL may be further provided under the third HTL 132.

An HBL may be further provided on the third EML 134. The HBL suppresses a transfer of holes injected into the third EML 134 to the third ETL 136 so as to improve recombination between electrons and holes in the third EML 134. Therefore, luminous efficiency of the third EML 134 can be improved. The third ETL 136 and the HBL may also be formed as a single layer. Further, the third ETL 136, the HBL, and the EIL may be referred to as electron transfer layers. That is, the electron transfer layer may be a layer for injecting or transferring electrons.

An EBL may be further provided under the third EML 134. The EBL suppresses a transfer of electrons injected into the third EML 134 to the third HTL 132 so as to improve recombination between electrons and holes in the third EML 134. Therefore, luminous efficiency of the third EML 134 can be improved. The third HTL 132 and the EBL may be formed as a single layer. Further, the third HTL 132, the EBL, and the HIL may be referred to as hole transfer layers. That is, the hole transfer layer may be a layer for injecting or transferring holes.

In the third EML 134, the holes supplied by the third HTL 132 and the electrons supplied by the third ETL 136 are recombined into excitons. An area where the excitons are generated may be referred to as a recombination zone (recombination area) or an emission zone (emission area).

The third EML 134 may be configured to emit a light of the same color as the first color. That is, the third EML 134 may include one among a blue light emitting layer, a deep blue light emitting layer, and a sky blue light emitting layer. The third EML 134 may have an emission area in the range of from 440 nm to 480 nm.

The third EML 134 may be a blue light emitting layer including an auxiliary light emitting layer capable of emitting a light of another color. The auxiliary light emitting layer may include one among a yellow-green light emitting layer or a red light emitting layer or a combination thereof. If the auxiliary light emitting layer is further provided, efficiency of green or red may be further improved. If the third EML 134 is configured to include the auxiliary light emitting layer, a yellow-green light emitting layer, a red light emitting layer, or a green light emitting layer may be on or under the third EML 134. Further, a yellow-green light emitting layer, a red light emitting layer, or a green light emitting layer may be formed as the auxiliary light emitting layer on and under the third EML 134 in the same manner or different manners. A location or the number of light emitting layers may be selected according to a configuration or characteristics of the device, but is not necessarily limited thereto. If the auxiliary light emitting layer is included in the third EML 134, the third EML 134 may have an emission area in the range of from 440 nm to 650 nm.

The third HTL 132, the third EML 134, the third ETL 136, the EIL, the HIL, the HBL, and the EBL constituting the third light emitting unit 130 may be referred to as organic layers.

The third EML 134 may include the same host as the first EML 114. The host of the first EML 114 is the same as described above. Therefore, detailed description thereof will be omitted. Accordingly, the third EML 134 may include at least one dopant and at least two hosts. One among the at least two hosts may have an electron mobility and a hole mobility different from each other. One among the at least two hosts may be a mixed host including a hole-type host having a hole transporting property and an electron-type host having an electron transporting property. Further, the other one among the at least two hosts may be a single host including an electron-type host having an electron transporting property. Therefore, the hosts included in the third EML 134 may include a first host including a first hole-type host and a first electron-type host and a second host including a second electron-type host.

Further, the third EML 134 may include two areas. A first area of the two areas may be disposed adjacent to the HTL and the second area may be adjacent to the ETL. The first area is formed of the first host which is a mixed host, and the second area may be formed of the second host which is a single host.

Further, a method for forming the third EML 134 may be the same as the method illustrated in FIG. 3.

Therefore, in the present disclosure, at least one among the first EML 114 and the third EML 134 includes at least two hosts. Thus, it is possible to provide the OLED device with improved efficiency, reduced driving voltage, and improved lifetime.

A second CGL 150 may be further provided between the second light emitting unit 120 and the third light emitting unit 130. The second CGL 150 is configured to adjust a balance of charges between the second light emitting unit 120 and the third light emitting unit 130. The second CGL 150 may include a second N-CGL and a second P-CGL.

The second N-CGL has a function of injecting electrons into the second light emitting unit 120. The second P-CGL has a function of injecting holes into the third light emitting unit 130.

The second N-CGL may be formed as an organic layer doped with alkali metal such as lithium (Li), sodium (Na), potassium (K), or cesium (Cs), or alkali earth metal such as magnesium (Mg), strontium (Sr), barium (Ba), or radium (Ra), but is not necessarily limited thereto.

The second P-CGL may be formed as an organic layer including a P-type dopant, but is not necessarily limited thereto. The second CGL 150 may be formed of the same materials as the first N-CGL and the first P-CGL of the first CGL 140, but is not necessarily limited thereto. Further, the second CGL 150 may be formed as a single layer.

The organic light emitting element according to the present disclosure can be applied to a bottom-emission OLED device, but is not limited thereto. The organic light emitting element according to the present disclosure can also be applied to a top-emission OLED device or a dual-emission OLED device. In the top-emission or dual-emission OLED device, locations of the light emitting layers may be changed according to characteristics or a configuration of the device.

Figure 4:
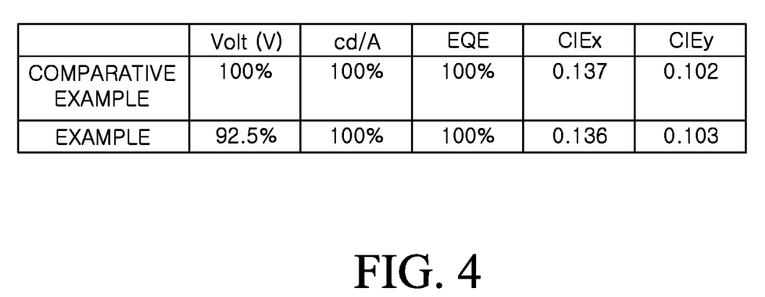
FIG. 4 is a table showing a result of all optical characteristics according to Comparative Example and Example of the present disclosure.

FIG. 4 is a table showing a result of optical characteristics according to a Comparative Example and an Example of the present disclosure. In the Comparative Example and the Example of the present disclosure, measurement was made from the substrate/first electrode/HTL/blue light emitting layer/ETL/second electrode. The Comparative Example was about a blue light emitting layer including an electron-type host as a single host. The Example was about a blue light emitting layer including a first host including a first hole-type host and a first electron-type host and a second host including a second electron-type host. FIG. 4 shows a driving voltage (Volt (V)), efficiency (cd/A), and external quantum efficiency (EQE) of Example where a voltage (Volt (V)), efficiency (cd/A), and external quantum efficiency (EQE) of Comparative Example are assumed as 100%.

As shown in FIG. 4, it can be seen that the driving voltage of Example of the present disclosure was decreased by about 7.5% as compared with Comparative Example including a single host.

Further, it can be seen that the efficiency (cd/A) of Example was equivalent to that of Comparative Example. Herein, the external quantum efficiency (EQE) refers to luminous efficiency when a light goes outside an organic light emitting element. It can be seen that EQE of Example was equivalent to that of Comparative Example.

Further, color coordinates (CIEx, CIEy) indicate color coordinates of a blue color. It can be seen that the color coordinates of Example of the present disclosure were equivalent to those of the Comparative Example. Therefore, if the Example of the present disclosure is applied, it is possible to provide an OLED device with a reduced driving voltage and non-reduced efficiency or EQE. That is, a blue light emitting layer between an anode and a cathode includes at least two hosts instead of a single host and is improved in electron mobility and hole mobility as compared with a blue light emitting layer including a single host. Therefore, it is possible to provide an OLED device with a reduced driving voltage.

The above-described organic light emitting element can be applied to a light apparatus, can be used as a light source of a liquid crystal display device, or can be applied to a display device. The OLED device including the organic light emitting element according to an exemplary embodiment of the present disclosure may be a white OLED device configured to emit a white light by the first light emitting unit including the first light emitting layer, the second light emitting unit including the second light emitting layer, and the third light emitting unit including the third light emitting layer. Therefore, if the organic light emitting element according to an exemplary embodiment of the present disclosure is applied to an OLED device, a white OLED device including four pixels, i.e., WRGB, may be implemented. Further, the OLED device including the organic light emitting element according to an exemplary embodiment of the present disclosure may be applied to a bottom-emission display device, a top-emission display device, a dual-emission display device, a lighting apparatus for vehicle, and the like. The lighting apparatus for vehicle may be at least one among a headlight, a high beam, a taillight, a brake light, a backup light, a stop light, a fog lamp, a turn signal light, and an auxiliary lamp, but is not necessarily limited thereto. Otherwise, it may be variously applied to all of indicating lights used for a driver to secure a clear view and also used to exchange signals between vehicles. Further, the OLED device including the organic light emitting element according to an exemplary embodiment of the present disclosure may be applied to a mobile device, a monitor, a TV, and the like.

As described above, the present disclosure includes a blue light emitting layer includes at least two hosts which are different from each other in electron mobility and hole mobility. Therefore, it is possible to provide an organic light emitting display device which is improved in efficiency by adjusting a balance between holes and electrons in a light emitting layer and thus reduced in driving voltage.

Further, according to the present disclosure, of the hosts included in the blue light emitting layer, a mixed host including an electron-type host and a hole-type host is adjacent to a hole transport layer. Therefore, it is possible to adjust a balance between holes and electrons in the blue light emitting layer and thus possible to reduce a driving voltage of the organic light emitting display device.

Furthermore, according to the present disclosure, of the hosts included in the blue light emitting layer, a single host including an electron-type host is adjacent to an electron transport layer. Therefore, it is possible to adjust a balance between holes and electrons in the blue light emitting layer and thus possible to reduce a driving voltage of the organic light emitting display device.

Also, the present disclosure includes the blue light emitting layer including at least two hosts which are different from each other in electron mobility and hole mobility. Therefore, it is possible to provide the organic light emitting display device with a reduced driving voltage as compared with a blue light emitting layer including a single host.

The exemplary embodiments of the present disclosure can also be described as follows:

According to an aspect of the present disclosure, there is provided an organic light emitting display device comprising: a first light emitting unit including a first light emitting layer; and a second light emitting unit on the first light emitting unit including a second light emitting layer. The first light emitting layer includes at least one dopant and at least two hosts. The at least two hosts are different from each other in electron mobility and hole mobility.

The at least two hosts may comprise a first host including a first hole-type host and a first electron-type host, and a second host including a second electron-type host.

An electron mobility of the first hole-type host may be higher than an electron mobility of the first electron-type host, and a hole mobility of the first hole-type host may be higher than a hole mobility of the first electron-type host.

An electron mobility of the first hole-type host may be higher than a hole mobility of the first hole-type host.

An electron mobility of the first electron-type host and an electron mobility of the second electron-type host may be higher than a hole mobility of the first electron-type host and a hole mobility of the second electron-type host.

A volume ratio of the first hole-type host and the first electron-type host may be 5:5.

Absolute values of LUMO energy levels of the first host and the second host may be in the range of from 3.0 eV to 6.0 eV, and absolute values of HOMO energy levels of the first host and the second host may be in the range of from 1.0 eV to 3.0 eV.

The first light emitting unit may further include a hole transfer layer and an electron transfer layer. The first host may be adjacent to the hole transfer layer and the second host may be adjacent to the electron transfer layer.

The organic light emitting display device further comprises: a third light emitting unit on the second light emitting unit including a third light emitting layer. The third light emitting layer may include at least two hosts which are different from each other in electron mobility and hole mobility.

The at least two hosts may include a first host including a first hole-type host and a first electron-type host, and a second host including a second electron-type host.

The third light emitting unit may further include a hole transfer layer and an electron transfer layer. The first host may be adjacent to the hole transfer layer and the second host may be adjacent to the electron transfer layer.

According to another aspect of the present disclosure, there is provided an organic light emitting display device including: a plurality of light emitting units between an anode and a cathode including a plurality of light emitting layers. At least one among the plurality of light emitting layers includes at least one dopant and at least two hosts. The at least two hosts include a first host including a first hole-type host and a first electron-type host, and a second host including a second electron-type host.

An electron mobility and a hole mobility of the first hole-type host may be higher than an electron mobility and a hole mobility of the first electron-type host.

A volume ratio of the first hole-type host and the first electron-type host may be 5:5.

An absolute value of an LUMO energy level of the first host may be the same as an absolute value of an LUMO energy level of the second host, and an absolute value of an HOMO energy level of the first host may be the same as an absolute value of an HOMO energy level of the second host.

The absolute values of the LUMO energy levels of the first host and the second host may be in the range of from 3.0 eV to 6.0 eV, and the absolute values of the HOMO energy levels of the first host and the second host may be in the range of from 1.0 eV to 3.0 eV.

The plurality of light emitting units further includes: a hole transfer layer and an electron transfer layer. The first host may be adjacent to the hole transfer layer and the second host may be adjacent to the electron transfer layer.

At least one among the plurality of light emitting layers may include a blue light emitting layer. The blue light emitting layer may include the first host and the second host.

According to yet another aspect of the present disclosure, there is provided an organic light emitting display device comprising: a plurality of light emitting units between an anode and a cathode including a plurality of light emitting layers. At least one among the plurality of light emitting layers includes two areas. A first area among the two areas includes a mixed host and a second area includes a single host.

The mixed host may include a first hole-type host and a first electron-type host, and the single host may include a second electron-type host.

An electron mobility of the first hole-type host may be higher than an electron mobility of the first electron-type host, and a hole mobility of the first hole-type host may be higher than a hole mobility of the first electron-type host.

An electron mobility of the first hole-type host may be higher than a hole mobility of the first hole-type host.

An electron mobility of the first electron-type host and an electron mobility of the second electron-type host may be higher than a hole mobility of the first electron-type host and a hole mobility of the second electron-type host.

A volume ratio of the first hole-type host and the first electron-type host may be 5:5.

The plurality of light emitting units further includes a hole transfer layer and an electron transfer layer. The mixed host may be adjacent to the hole transfer layer and the single host may be adjacent to the electron transfer layer.

The light emitting layer including at least two areas may include a blue light emitting layer.

According to yet another aspect of the present disclosure, there is provided an organic light emitting display device having light emitting layers between an anode and a cathode. The light emitting layers include a blue light emitting layer. The blue light emitting layer includes at least two hosts and is improved in electron mobility and hole mobility and thus reduced in driving voltage as compared with a blue light emitting layer including a single host.

The at least two hosts may include a first host including a first hole-type host and a first electron-type host and a second host including a second electron-type host.

An electron mobility of the first hole-type host may be higher than an electron mobility of the first electron-type host, and a hole mobility of the first hole-type host may be higher than a hole mobility of the first electron-type host.

An electron mobility of the first hole-type host may be higher than a hole mobility of the first hole-type host.

An electron mobility of the first electron-type host and an electron mobility of the second electron-type host may be higher than a hole mobility of the first electron-type host and a hole mobility of the second electron-type host.

A volume ratio of the first hole-type host and the first electron-type host may be 5:5.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display device comprising:
   a first light emitting unit including a first light emitting layer; and
   a second light emitting unit on the first light emitting unit including a second light emitting layer, wherein the first light emitting unit and the second light emitting unit are between an anode and a cathode, wherein the first light emitting layer includes at least one dopant and at least two hosts, wherein the at least two hosts are different from each other in electron mobility and hole mobility, wherein the at least two hosts comprise a first host including a first hole-type host and a first electron-type host, and a second host including a second electron-type host, wherein an electron mobility of the first hole-type host is higher than an electron mobility of the first electron-type host, and a hole mobility of the first hole-type host is higher than a hole mobility of the first electron-type host, and wherein absolute values of LUMO (lowest unoccupied molecular orbital) energy levels of the first host and second host are same and absolute values of HOMO (highest occupied molecular orbital) energy levels of the first host and second host are same.

2. The organic light emitting display device according to claim 1, wherein an electron mobility of the first hole-type host is higher than a hole mobility of the first hole-type host.

3. The organic light emitting display device according to claim 1, wherein an electron mobility of the first electron-type host and an electron mobility of the second electron-type host are higher than a hole mobility of the first electron-type host and a hole mobility of the second electron-type host.

4. The organic light emitting display device according to claim 1, wherein a volume ratio of the first hole-type host and the first electron-type host is 5:5.

5. The organic light emitting display device according to claim 1, wherein absolute values of the LUMO energy levels of the first host and the second host are in the range of from 3.0 eV to 6.0 eV, and wherein absolute values of the HOMO energy levels of the first host and the second host are in the range of from 1.0 eV to 3.0 eV.

6. The organic light emitting display device according to claim 1, wherein the first light emitting unit further includes a hole transfer layer and an electron transfer layer, and wherein the first host is adjacent to the hole transfer layer and the second host is adjacent to the electron transfer layer.

7. The organic light emitting display device according to claim 1, further comprising:

a third light emitting unit on the second light emitting unit including a third light emitting layer, wherein the third light emitting layer includes at least two hosts which are different from each other in electron mobility and hole mobility.

8. The organic light emitting display device according to claim 7, wherein the third light emitting unit further includes a hole transfer layer and an electron transfer layer, and wherein the first host is adjacent to the hole transfer layer and the second host is adjacent to the electron transfer layer.

9. An organic light emitting display device comprising:

a plurality of light emitting units between an anode and a cathode including a plurality of light emitting layers, wherein at least one of the plurality of light emitting layers includes at least one dopant and at least two hosts, and the at least two hosts include a first host including a first hole-type host and a first electron-type host, and a second host including a second electron-type host, wherein an electron mobility of the first hole-type host is higher than an electron mobility of the first electron-type host, and a hole mobility of the first hole-type host is higher than a hole mobility of the first electron-type host, wherein an absolute value of a LUMO (lowest unoccupied molecular orbital) energy level of the first host is same as an absolute value of a LUMO energy level of the second host, and wherein an absolute value of a HOMO (highest occupied molecular orbital) energy level of the first host is same as an absolute value of a HOMO energy level of the second host.

10. The organic light emitting display device according to claim 9, wherein a volume ratio of the first hole-type host and the first electron-type host is 5:5.

11. The organic light emitting display device according to claim 9, wherein the absolute values of the LUMO energy levels of the first host and the second host are in the range of from 3.0 eV to 6.0 eV, and the absolute values of the HOMO energy levels of the first host and the second host are in the range of from 1.0 eV to 3.0 eV.

12. The organic light emitting display device according to claim 9, wherein the plurality of light emitting units further includes a hole transfer layer and an electron transfer layer, and wherein the first host is adjacent to the hole transfer layer and the second host is adjacent to the electron transfer layer.

13. The organic light emitting display device according to claim 9, wherein at least one among the plurality of light emitting layers includes a blue light emitting layer, and wherein the blue light emitting layer includes the first host and the second host.

14. An organic light emitting display device comprising:

a plurality of light emitting units between an anode and a cathode including a plurality of light emitting layers, wherein at least one among the plurality of light emitting layers includes two areas, and a first area among the two areas includes a mixed host and a second area includes a single host, wherein the mixed host includes a first hole-type host and a first electron-type host, and the single host includes a second electron-type host, wherein an electron mobility of the first hole-type host is higher than an electron mobility of the first electron-type host, and a hole mobility of the first hole-type host is higher than a hole mobility of the first electron-type host, wherein an absolute value of a LUMO (lowest unoccupied molecular orbital) energy level of the mixed host is same as an absolute value of a LUMO energy level of the single host, and wherein an absolute value of a HOMO (highest occupied molecular orbital) energy level of the mixed host is same as an absolute value of a HOMO energy level of the single host.

15. The organic light emitting display device according to claim 14, wherein an electron mobility of the first hole-type host is higher than a hole mobility of the first hole-type host.

16. The organic light emitting display device according to claim 14, wherein an electron mobility of the first electron-type host and an electron mobility of the second electron-type host are higher than a hole mobility of the first electron-type host and a hole mobility of the second electron-type host.

17. The organic light emitting display device according to claim 14, wherein a volume ratio of the first hole-type host and the first electron-type host is 5:5.

18. The organic light emitting display device according to claim 14, wherein the plurality of light emitting units further includes a hole transfer layer and an electron transfer layer, and
wherein the mixed host is adjacent to the hole transfer layer and the single host is adjacent to the electron transfer layer.

19. The organic light emitting display device according to claim 14, wherein the light emitting layer including at least two areas includes a blue light emitting layer.

20. An organic light emitting display device having light emitting layers between an anode and a cathode,
wherein the light emitting layers include a blue light emitting layer, and the blue light emitting layer includes at least two hosts and is improved in electron mobility and hole mobility and thus reduced in driving voltage as compared with a blue light emitting layer including a single host,
wherein the at least two hosts include a first host including a first hole-type host and a first electron-type host, and a second host including a second electron-type host,
wherein an electron mobility of the first hole-type host is higher than an electron mobility of the first electron-type host, and a hole mobility of the first hole-type host is higher than a hole mobility of the first electron-type, and
wherein absolute values of LUMO (lowest unoccupied molecular orbital) energy levels of the at least two hosts are same and absolute values of HOMO (highest occupied molecular orbital) energy levels of the at least two hosts are same.

21. The organic light emitting display device according to claim 20, wherein an electron mobility of the first hole-type host is higher than a hole mobility of the first hole-type host.

22. The organic light emitting display device according to claim 20, wherein an electron mobility of the first electron-type host and an electron mobility of the second electron-type host are higher than a hole mobility of the first electron-type host and a hole mobility of the second electron-type host.

23. The organic light emitting display device according to claim 20, wherein a volume ratio of the first hole-type host and the first electron-type host is 5:5.

* * * * *